United States Patent [19]

Hatanaka et al.

[11] Patent Number: 5,672,902
[45] Date of Patent: Sep. 30, 1997

[54] IMAGE SENSOR

[75] Inventors: Katsunori Hatanaka, Yokohama;
Toshihiro Saika; Takayuki Ishii, both
of Hiratsuka; Katsuhiko Yamada,
Atsugi, all of Japan

[73] Assignee: Canon Kabushiki Kaisha, Tokyo,
Japan

[21] Appl. No.: 393,884

[22] Filed: Feb. 22, 1995

Related U.S. Application Data

[63] Continuation of Ser. No. 31,018, Mar. 11, 1993, abandoned, which is a continuation of Ser. No. 642,162, Jan. 17, 1991, abandoned, which is a continuation of Ser. No. 207,200, Jun. 16, 1988, abandoned.

[30] Foreign Application Priority Data

Jun. 26, 1987 [JP] Japan ................... 62-160506

[51] Int. Cl.$^6$ ................... H01L 31/10; H01L 27/02
[52] U.S. Cl. ................... 257/431; 257/433; 257/446; 257/491
[58] Field of Search ................... 357/30 L, 30 D, 357/30 G, 30 M, 41, 23.7, 30 I, 30 PF, 45; 257/431, 491, 433, 446

[56] References Cited

U.S. PATENT DOCUMENTS

| | | | |
|---|---|---|---|
| 3,590,340 | 6/1971 | Kubo et al. | 257/363 |
| 4,393,464 | 7/1983 | Knapp et al. | 357/45 |
| 4,438,449 | 3/1984 | Usuda | 257/356 |
| 4,763,010 | 8/1988 | Fukaya et al. | 357/2 |
| 4,803,536 | 2/1989 | Tuan | 357/45 |
| 4,819,047 | 4/1989 | Gilfeather et al. | 357/45 |
| 4,823,178 | 4/1989 | Suda | 357/23.7 |
| 4,862,237 | 8/1989 | Morozumi | 357/23.7 |
| 4,866,291 | 9/1989 | Shimada et al. | 357/23.7 |

FOREIGN PATENT DOCUMENTS

| | | | |
|---|---|---|---|
| 0136868 | 4/1985 | European Pat. Off. | 357/45 |
| 0268111 | 5/1988 | European Pat. Off. | 357/45 |
| 60-212075 | 10/1985 | Japan . | |

*Primary Examiner*—Donald Monin
*Attorney, Agent, or Firm*—Fitzpatrick, Cella, Harper & Scinto

[57] ABSTRACT

An image sensor includes a substrate on which are formed a light-receiving element and a thin-film transistor for transferring an output from the light-receiving element, and a silicon integrated circuit chip for driving the thin-film transistor and processing signals. All externally connected input/output signal lines are extracted through or electrically connected to the silicon integrated circuit chip.

30 Claims, 4 Drawing Sheets

IMAGE SENSOR

This application is a continuation of application Ser. No. 08/031,018, filed Mar. 11, 1993, now abandoned, which is a continuation of application Ser. No. 07/642,162, filed Jan. 17, 1991, now abandoned which is a continuation of application Ser. No. 07/207,200, filed Jun. 16, 1988, now abandoned.

BACKGROUND OF THE INVENTION

1. Field of the Invention

The present invention relates to an image sensor represented by a contact type line sensor used in a facsimile system, an image scanner, or the like and, more particularly, to an image sensor having a signal scanning circuit of thin-film transistors formed on a sensor substrate.

2. Related Background Art

The assignee of the subject application has previously proposed an image sensor using thin-film transistors in a signal scanning circuit in Japaneses Patent Laid-Open (Kokai) Nos. 56-138967, 56-138968, 56-138362, and 56-138969, and Japanese Patent Application Nos. 61-184990 and 61-311205.

FIG. 1 shows an equivalent circuit diagram of a conventional image sensor obtained such that thin-film transistors (to be referred to as TFTs hereinafter), TFT sensor elements, storage capacitors, a matrix wiring, and the like are integrally formed on a glass substrate using hydrogenated amorphous silicon (to be referred to as a-Si:H hereinafter). The image sensor includes photosensors $S_l$ to $S_{n \cdot m}$ each having a TFT structure, and storage capacitors $C_{Sl}$ to $C_{Sn \cdot m}$ for storing photocurrents from the sensors $S_l$ to $S_{n \cdot m}$. TFTs $T_l$ to $T_{n \cdot m}$ transfer charges stored in the storage capacitors $C_{Sl}$ to $C_{Sn \cdot m}$ to load capacitors $C_{Ll}$ to $C_{Ln}$. TFTs $R_l$ to $R_{n \cdot m}$ reset the storage capacitors $C_{Sl}$ to $C_{Sn \cdot m}$ to reset potentials $V_R$. Gate electrodes of the transfer and reset TFTs are grouped in units of blocks and are connected to outputs $G_l$ to $G_{m+l}$ of a gate driving IC 4. The TFT source electrodes of the respective blocks are commonly connected in units of source lines having identical positions and are connected to input terminals $S_{wl}$ to $S_{wn}$ of a signal switching IC 3. A sensor bias voltage $V_S$, a sensor gate bias voltage $V_B$, and a reset bias voltage $V_R$ have predetermined values, respectively.

FIG. 2 shows an arrangement of a conventional sensor unit. The sensor unit includes a casing 1, a sensor substrate 2, a signal switching IC 3, a gate driving IC 4, an extracting flexible printed circuit board 5, bias lines 6 for the bias voltages $V_R$, $V_S$, and $V_B$, and GND, and a connector 7 connected to a main unit. The unit also includes a sensor 9, storage capacitors 10, and TFTs 11. In this arrangement, optical components such as a lens, a light source, and the like are omitted.

The conventional image sensor described above, however, presents electrostatic problems.

An element such as a TFT, a TFT sensor, and a storage capacitor formed on a substrate has a structure including a thin insulating interlayer. Therefore, when a voltage having a level exceeding a predetermined level is applied, breakdown occurs in the insulating interlayer and the elements are damaged. This damage easily occurs by electrostatic components generated by the clothing of an operator or the like.

During sensor substrate fabrication, IC mounting, and sensor unit assembly, generation of static electricity is satisfactorily prevented so as to solve the above problems. However, after sensor units are shipped, they are handled in the same manner as general electronic components until they are built into main units of application equipment in a factory of a facsimile system, an image scanner, or the like. For this reason, defects due to electrostatic breakdown often occur.

A cause of defects was examined in a sensor unit shown in FIG. 1. It was confirmed that the TFTs, the sensors, and the like connected from the connector 7 to the bias lines 6 for bias voltages $V_R$, $V_S$, and $V_B$ were damaged.

According to a conventional method of preventing electrostatic breakdown, protective diodes are used in CMOS ICs. In other words, each diode is connected to a power input terminal and a GND input terminal so as to dissipate the static electricity.

When the above method is employed, two diodes are required for each bias line, and a chip must be mounted in a unit. As a result, the above method is not preferred in view of cost, mounting space, and the like.

SUMMARY OF THE INVENTION

It is an object of the present invention to provide an image sensor which can eliminate the above problems. In order to achieve this object, there is provided an image sensor including a substrate on which a light-receiving element and a thin-film transistor for transferring an output from the light-receiving element are formed, and a silicon integrated circuit chip for driving the thin-film transistor and processing signals, wherein all externally connected input/output signal lines are extracted through or electrically connect to the silicon integrated circuit chip.

According to the present invention, with the above arrangement, an electrostatic prevention circuit for sensor bias lines is arranged in a driving IC chip, thereby preventing electrostatic breakdown of a sensor unit. Therefore, a low-cost and compact image sensor free from electrostatic breakdown can be provided.

DETAILED DESCRIPTION OF THE PREFERRED EMBODIMENTS

Figure 1:
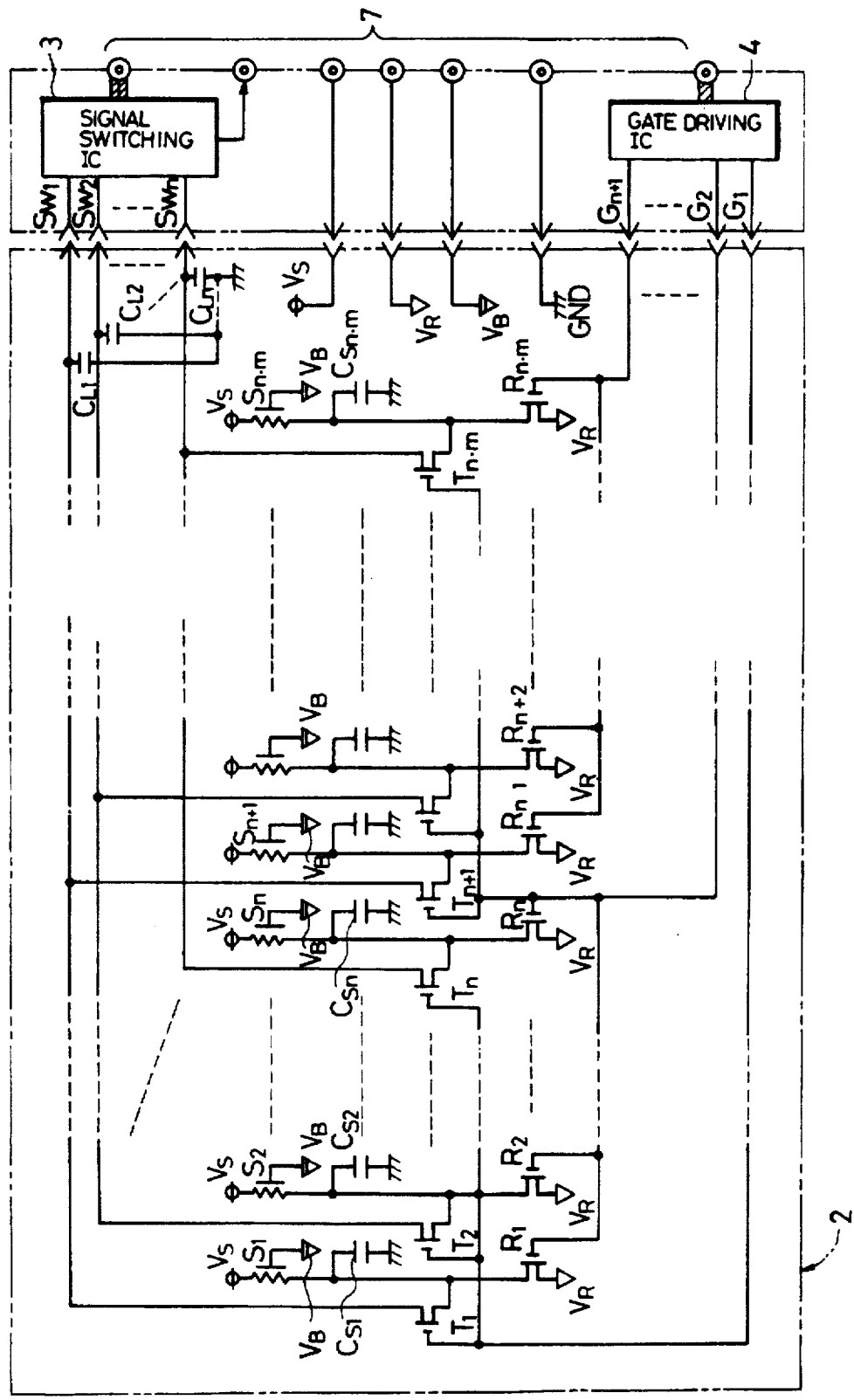
FIG. 1 is an equivalent circuit diagram of a conventional line sensor.
Figure 2:
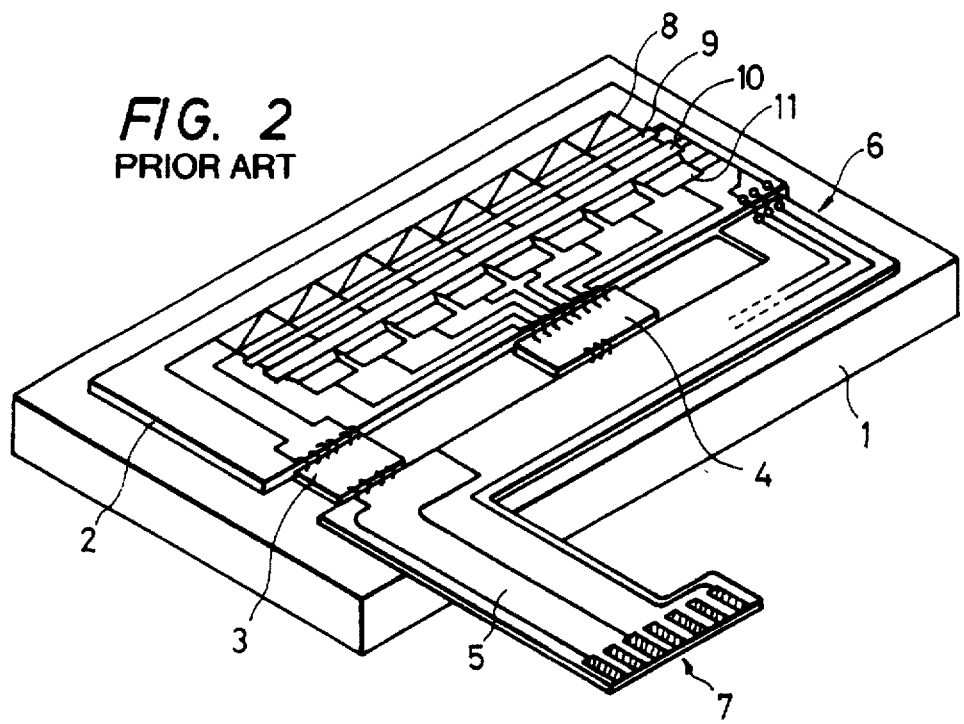
FIG. 2 is a perspective view showing an arrangement of a conventional sensor unit.
Figure 3:
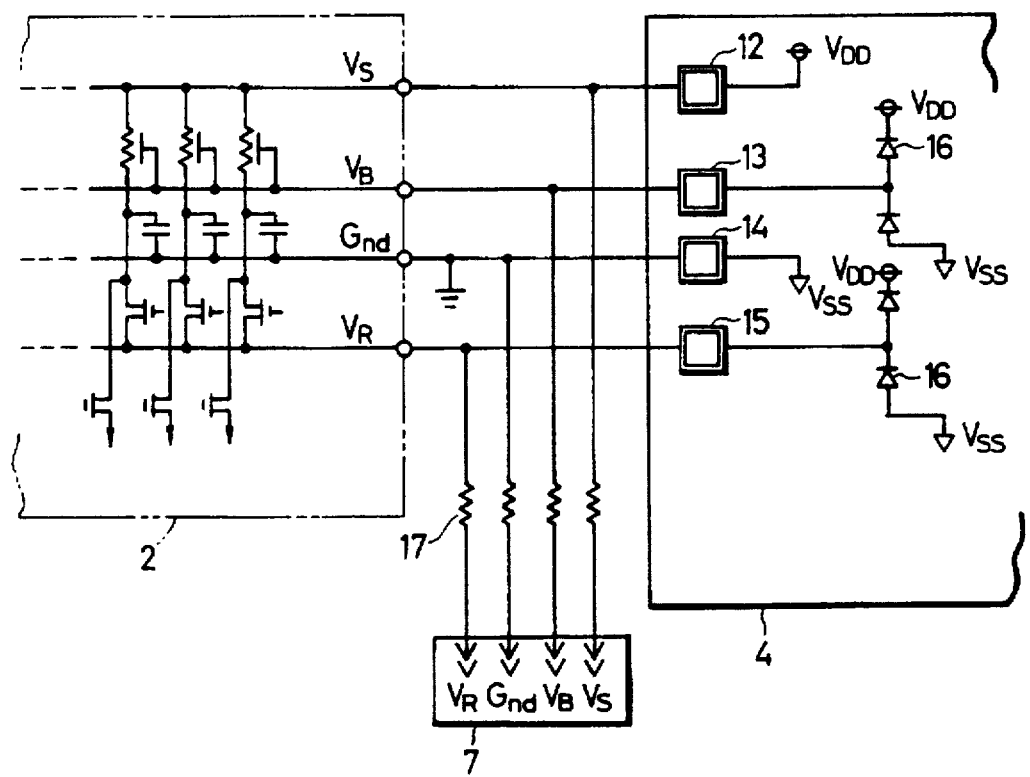
FIG. 3 is an equivalent circuit diagram of an electrostatic prevention section according to the present invention.

FIG. 3 shows a preferred embodiment of an electrostatic prevention circuit in an image sensor according to the present invention.

This circuit includes a sensor substrate 2, a gate driving IC 4, an external connector 7, and a connecting bonding pad 12 commonly connected with a sensor bias power supply $V_S$ and to a power supply $V_{DD}$ of the gate driving IC. A bonding pad 14 is connected to ground terminals ($V_{SS}$) of the gate driving IC and the storage capacitors. Terminals 13 and 15 are respectively connected to clamp diodes 16 in the gate driving IC. Each clamp diode 16 is connected to power supply voltages $V_{DD}$ and $V_{SS}$. The terminals 13 and 15 are respectively connected to terminals $V_B$ and $V_R$ of the sensor substrate. An extracting flexible cable comprises wiring resistors 17.

Figure 4:
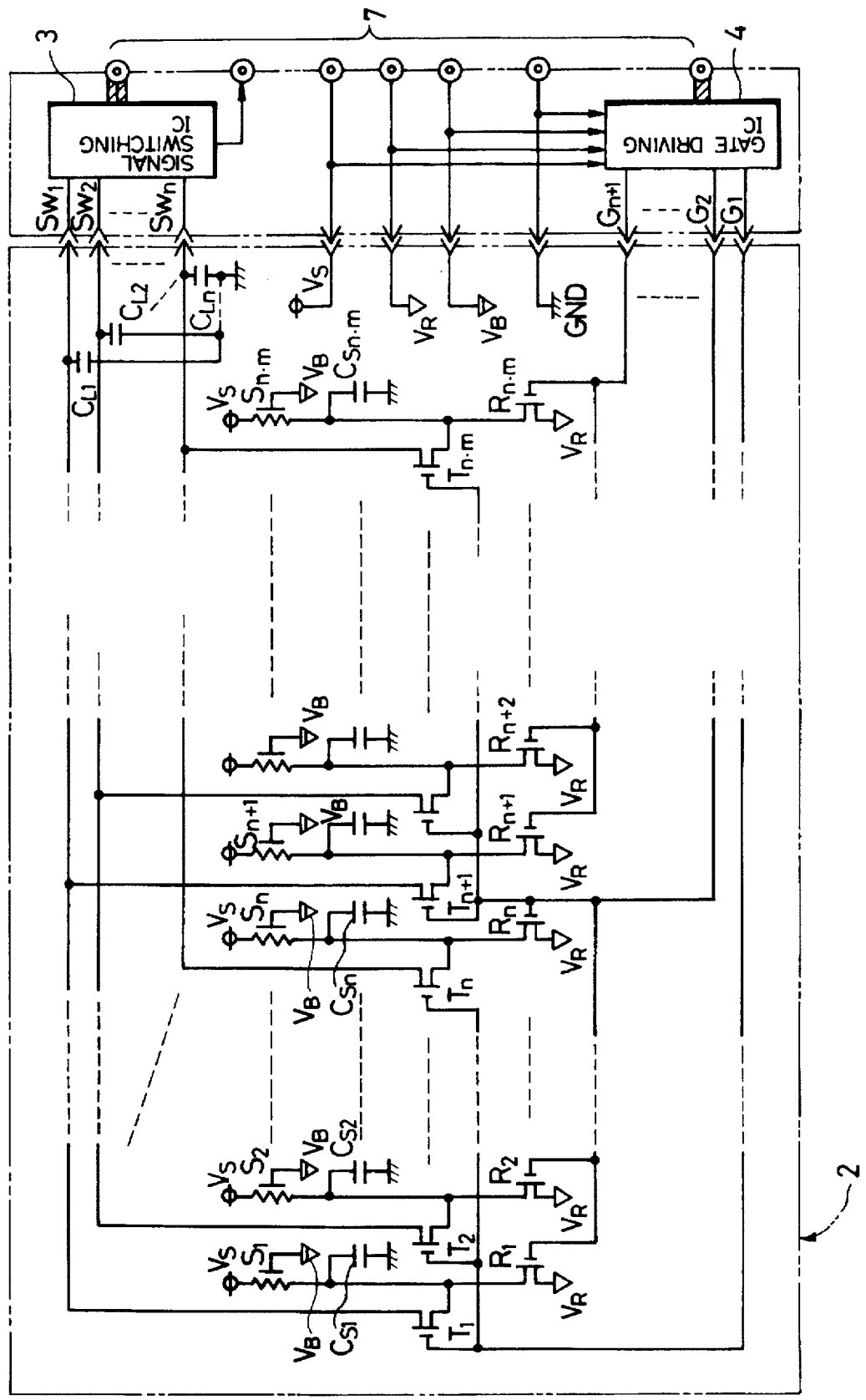
FIG. 4 is an equivalent circuit diagram of a line sensor employing the electrostatic prevention technique according to the present invention.

FIG. 4 shows an equivalent circuit diagram of the image sensor according to the present invention. All external extracting lines of a connector 7 are extracted through or electrically connected to ICs.

Figure 5:
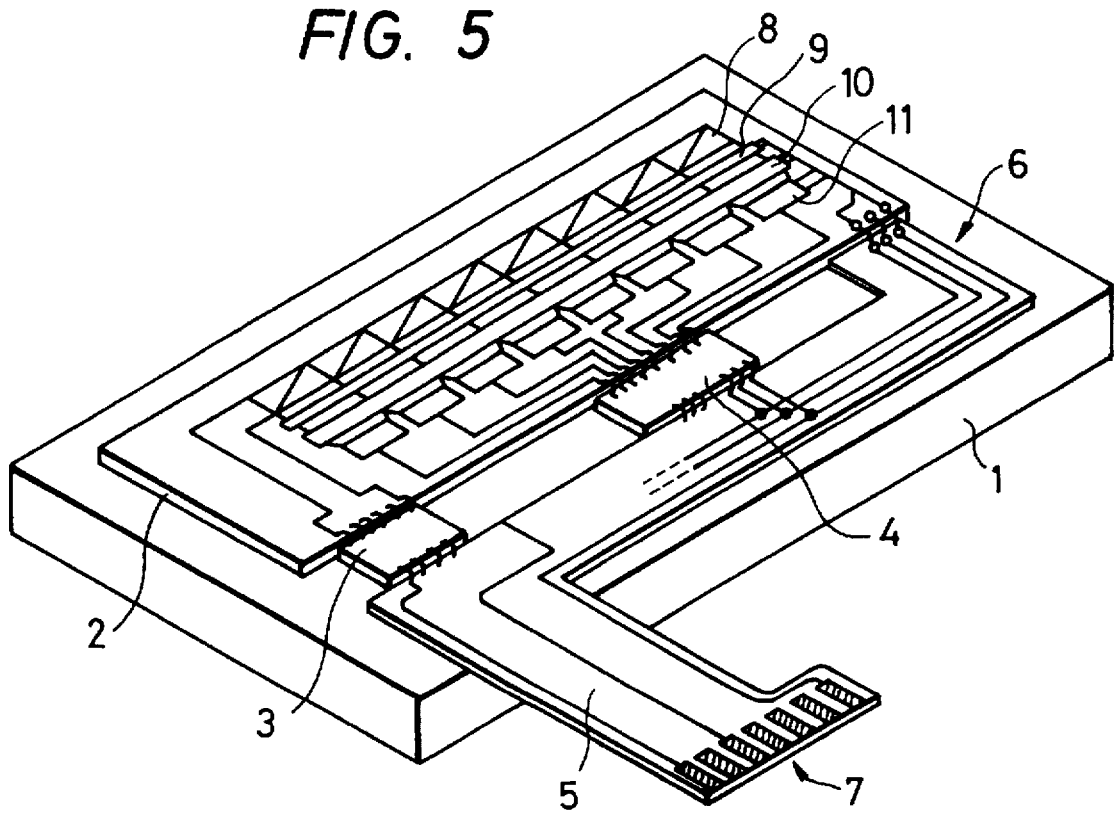
FIG. 5 is a perspective view showing an arrangement of a sensor unit employing the electrostatic prevention technique according to the present invention.

FIG. 5 is a perspective view showing a unit arrangement of the image sensor according to the present invention. The bias lines for bias voltages $V_R$, $V_B$, and $V_S$ run through a wiring pattern of an extracting flexible substrate and are connected to the bonding pad of the gate driving IC. Then, the bias lines are connected to the extracting connector 7.

Assume that static electricity is applied to the extracting connector portion 7 of the sensor unit according to the present invention in handling during transportation and inspection, or in mounting. In this case, the potential is clamped in the driving IC, and TFTs and sensors in the sensor substrate are not damaged. In addition, even if a high voltage is erroneously applied to the bias lines during a test, a clamp operation is performed or damage occurs only to the driving IC and the expensive sensor substrate is not damaged.

The bias lines are connected to the gate driving IC according to the present invention. However, the bias lines may be connected to a signal switching IC, thus obtaining the same effects as described above. The resistors 17 of the extracting flexible cable in FIG. 3 must have high resistances but must cause only negligible voltage drops. The resistances are therefore selected by adjustment of the material or the line width of the wiring pattern.

Since other lines $S_{w1}$ to $S_{wn}$, and $G_l$ to $G_{m+l}$ of the sensor substrate are respectively and directly connected to the ICs, electrostatic breakdown hardly occurs in a sensor unit.

As has been described above, the extracting lines from the sensor substrate are connected to the driving IC in the sensor unit and extracted to external circuits. Therefore, the image sensor of the present invention has the following advantages:

(1) The image sensor is free from electrostatic breakdown in handling and the reliability of the image sensor is improved.

(2) Easy methods may be applied to prevent electrostatic breakdown during transportation, inspection, and mounting, thereby realizing low cost.

(3) The cost of the products is not increased and an electrostatic countermeasure can be provided by simply increasing the number of circuits in the IC.

What is claimed is:

1. An image sensor comprising:
a carrier substrate comprising:
 a sensor substrate;
 a sensor section comprising a light-receiving element formed on said sensor substrate;
 a thin-film transistor section, formed on said sensor substrate, for transferring an output signal from said light-receiving element; and
 a sensor wiring section, comprising a terminal section, for electrically connecting said sensor section and said thin-film transistor section to said terminal section, said terminal section for connection outside said image sensor;
a silicon integrated circuit chip, different from said sensor substrate, for controlling said thin-film transistor section, said silicon integrated circuit having a clamping circuit coupled to said thin-film transistor section; and
a wiring section comprising a plurality of input/output signal lines, coupled to said sensor substrate, for inputting/outputting signals between said sensor substrate and outside said image sensor, wherein all of said input/output signal lines are also electrically connected to said clamping circuit provided on said silicon integrated circuit chip for preventing electrostatic breakdown in said light-receiving element and/or said thin-film transistor section caused by an excessive voltage being supplied that is higher than a predetermined level.

2. An image sensor according to claim 1, wherein said clamping circuit comprises a clamp diode.

3. An image sensor comprising:
a sensor substrate comprising:
 a plurality of light-receiving elements arranged in an array for converting image information into an electrical signal; and
 a thin-film transistor coupled to said light-receiving elements;
an integrated circuit chip, different from said sensor substrate, for controlling said thin-film transistor, said integrated circuit having a clamping circuit coupled to said thin-film transistor for outputting an electrical signal carrying image information through said thin-film transistor; and
input/output signal lines for outputting the electrical signal carrying the image information to an external unit, and for supplying to said integrated circuit chip a signal for driving said thin-film transistor, wherein all of said input/output signal lines are also connected to said clamping circuit provided in said integrated circuit chip.

4. An image sensor according to claim 3, further comprising a storage capacitor coupled to said transistor.

5. An image sensor according to claim 3, wherein said light-receiving elements comprise a thin-film-transistor type sensor.

6. An image sensor according to claim 3, wherein said light-receiving elements and said thin-film transistor are both formed on said sensor substrate.

7. An image sensor according to claim 3, wherein said clamping circuit includes a clamp diode.

8. An image sensor according to claim 3, wherein said light-receiving elements comprise hydrogenated amorphous silicon.

9. An image sensor according to claim 3, wherein said thin-film transistor comprises hydrogenated amorphous silicon.

10. An image sensor according to claim 3, wherein said clamping circuit prevents application of excessive voltage higher than a predetermined level to said photoreceiving element and/or said thin-film transistor.

11. An image sensor according to claim 10, wherein said clamping circuit comprises a clamp diode.

12. An image sensor comprising:
a sensor substrate having a plurality of light-receiving elements arranged in an array, a matrix wiring section for receiving output signals from said light-receiving elements, and at least one of: (1) a thin-film transistor for transmitting said output signals through said matrix wiring section to a unit outside of said sensor substrate and (2) a thin-film transistor for controlling said light-receiving elements through said matrix wiring section;

an integrated circuit element, different from said sensor substrate, for driving said thin-film transistor of said sensor substrate, said integrated circuit element having a clamping circuit; and input/output lines, for supplying bias voltage to said light-receiving elements of said sensor substrate and being also electrically connected to said integrated circuit element, wherein said input/output lines are also connected to said sensor substrate through said integrated circuit element, said clamping circuit being coupled to said input/output lines.

13. An image sensor according to claim 12, further comprising a plurality of said integrated circuit elements, and wherein said integrated circuit elements provide switching signals to said sensor substrate and gate driving signals to said thin-film transistor.

14. An image sensor according to claim 12, wherein said integrated circuit element includes a gate drive circuit element and a signal switch circuit element, and wherein said input output lines have a line for supplying bias voltage to said gatedrive circuit element.

15. An image sensor according to claim 12, wherein said integrated circuit element includes a gate drive circuit element and a signal switch circuit element, and wherein said input output lines have a line for supplying bias voltage to said signal switch circuit element.

16. An image sensor according to claim 12, wherein said sensor substrate includes a storage capacitor for storing an output signal of said light-receiving elements.

17. An image sensor according to claim 12, wherein said sensor substrate and said integrated circuit element are formed on a common support.

18. An image sensor according to claim 12, wherein said image sensor has a storage capacitor.

19. An image sensor according to claim 12, wherein each of said light-receiving elements comprises a thin-film transistor type sensor.

20. An image sensor according to claim 12, wherein said light-receiving elements and said thin-film transistors are commonly formed on said sensor substrate.

21. An image sensor according to claim 12, wherein said clamping circuit includes a clamp diode.

22. An image sensor according to claim 12, wherein each of said light-receiving elements comprises hydrogenated amorphous silicon.

23. An image sensor according to claim 12, wherein each said thin-film transistor comprises hydrogenated amorphous silicon.

24. An image sensor according to claim 12, wherein said clamping circuit prevents application of excessive voltage higher than a predetermined level to said photoreceiving elements and/or said thin-film transistor.

25. An image sensor according to claim 24, wherein said clamping circuit comprises a clamp diode.

26. An image sensor comprising:

a carrier substrate comprising:

a sensor substrate;

a sensor section comprising a light-receiving element formed on the sensor substrate;

a thin-film transistor section, formed on the sensor substrate, for transferring an output signal from the light-receiving element; and a sensor wiring section, comprising a terminal section, for electrically connecting the sensor section and the thin-film transistor section to the terminal section, the terminal section for connection outside the image sensor;

a silicon integrated circuit chip, different from the sensor substrate, for controlling the thin-film transistor section, said silicon integrated circuit chip having a clamping circuit coupled to the thin-film transistor section; and a wiring section comprising a plurality of input/output signal lines, coupled to the sensor substrate, for inputting/outputting signals between the sensor substrate and outside the image sensor, wherein all of the input/output signal lines are electrically connected to the integrated circuit chip, and at least a subset of the input/output signal lines are electrically connected to the clamping circuit which is different from a predetermined connecting portion, so as to prevent electrostatic breakdown in the light-receiving element and/or the thin-film transistor section caused by an excessive voltage being supplied that is higher than a predetermined level.

27. The image sensor according to claim 26, wherein the light-receiving elements are arranged in an array.

28. The image sensor according to claim 26, wherein the clamping circuit comprises a clamping diode.

29. The image sensor according to claim 26, wherein the subset of the input/output signal lines comprises a bias line and a ground line.

30. The image sensor according to claim 26, wherein the integrated circuit having the clamping circuit is an integrated circuit chip for gate driving or an integrated circuit chip for signal switching.

* * * * *

UNITED STATES PATENT AND TRADEMARK OFFICE
CERTIFICATE OF CORRECTION

PATENT NO. : 5,672,902

DATED : September 30, 1997

INVENTOR(S): KATSUNORI HATANAKA ET AL.

It is certified that error appears in the above-identified patent and that said Letters Patent is hereby corrected as shown below:

COLUMN 1
  Line 21, "Japaneses" should read --Japanese--;
  Line 33, "$S_{n,m}$ TFTs" should read --$S_{n,m}$. TFTs--.

COLUMN 2
  Line 30, "connect" should read --connected--.

COLUMN 5
  Line 20, "input output" should read --input/output--;
  Line 21, "gatedrive" should read --gate drive--;
  Line 25, "input output" should read --input/output--.

Signed and Sealed this

Seventh Day of April, 1998

Attest:

BRUCE LEHMAN

*Attesting Officer*      *Commissioner of Patents and Trademarks*